United States Patent
Bajaj et al.

[11] Patent Number: 6,045,435
[45] Date of Patent: Apr. 4, 2000

[54] LOW SELECTIVITY CHEMICAL MECHANICAL POLISHING (CMP) PROCESS FOR USE ON INTEGRATED CIRCUIT METAL INTERCONNECTS

[75] Inventors: Rajeev Bajaj; Subramoney Iyer; Thom Kobayashi, all of Austin; Jaime Saravia, Roundrock; Mark Fernandes; David K. Watts, both of Austin, all of Tex.

[73] Assignee: Motorola, Inc., Schaumburg, Ill.

[21] Appl. No.: 08/905,757

[22] Filed: Aug. 4, 1997

[51] Int. Cl.⁷ ........................................... B24B 1/00
[52] U.S. Cl. .................. 451/41; 438/692; 216/88
[58] Field of Search .............. 451/41, 285–289; 438/692, 693; 216/89, 88

[56] References Cited

U.S. PATENT DOCUMENTS

| | | |
|---|---|---|
| 5,328,553 | 7/1994 | Poon . |
| 5,354,490 | 10/1994 | Yu et al. ................. 252/79.1 |
| 5,486,131 | 1/1996 | Cesna et al. ............... 451/56 |
| 5,514,245 | 5/1996 | Doan et al. .............. 156/636.1 |
| 5,540,810 | 7/1996 | Sandhu et al. ............ 156/636.1 |
| 5,578,523 | 11/1996 | Fiordalice et al. ........... 438/692 |
| 5,693,239 | 12/1997 | Wang et al. ................ 216/88 |
| 5,773,364 | 6/1998 | Farkas et al. ............. 438/692 |
| 5,783,489 | 7/1998 | Kaufman et al. ........... 438/692 |
| 5,821,168 | 10/1998 | Jain ......................... 438/692 |

OTHER PUBLICATIONS

Carter W. Kaanta, et al., "Dual Damascene: A ULSI Wiring Technology", Jun. 11–12, 1991 Proceedings, 8th International IEEE VLSI Mul Interconnection VMIC Conference, pp. 144–152.

*Primary Examiner*—Robert A. Rose
*Assistant Examiner*—George Nguyen
*Attorney, Agent, or Firm*—Keith E. Witek

[57] ABSTRACT

A method for polishing a metal layer (20) containing a combination of wide features (12), low density features (14), and high density features (18), is illustrated. A hydrophilic polish pad (24) having a shore D hardness of greater than 50 is used along with slurry (22) containing silica and an acidic based oxidizer such as oxadic acid in a chemical mechanical polishing (CMP) process. The result is less than 5:1 and preferably 1:1. This low selectivity results in the metal layer (20) being polished to a level below the surface of the surrounding oxide in a timed-controlled polish.

18 Claims, 3 Drawing Sheets

LOW SELECTIVITY CHEMICAL MECHANICAL POLISHING (CMP) PROCESS FOR USE ON INTEGRATED CIRCUIT METAL INTERCONNECTS

FIELD OF THE INVENTION

The present invention relates generally to semiconductor manufacturing, and more particularly to, polishing metal interconnect layers on an integrated circuit (IC) using a low selectivity chemical mechanical polish (CMP).

BACKGROUND OF THE INVENTION

Chemical mechanical polishing (CMP) is presently used to planarize a variety of materials used in semiconductor integrated circuit (IC) devices. For example, CMP is used to polish dielectric layers such as silicon dioxide, and metal layers such as tungsten, aluminum, and copper. Regardless of the material being polished, similar polishing techniques are used. For instance, all CMP polishing systems typically include a polishing platen, on which is attached a polishing pad. As the platen and pad are being rotated, a slurry is dispensed on a semiconductor wafer while the semiconductor wafer is pressed against the rotating pad at some predetermined force. A combination of the chemical reaction between the slurry and the layer-being-polished and mechanical interaction/force between the abrasive particles within the slurry and the layer-being-polished causes portions of the wafer layer to be removed and results in a planarization of a top surface of the wafer.

Referring to prior art FIG. 1, a low density structure 502, which will generally be an isolated electrical contact, is shown following a prior art metal polishing step. The feature 502 is an isolated feature in that there is no other other inlaid features of its type in close proximity thereto. Very isolated metallic regions which expose a small top surface area when compared to exposed top surface dielectric material are referred to as a low density feature areas. Because FIG. 1 shows a low density feature area, structure 502 is capable of being polished with the known CMP techniques discussed above without substantial dishing problems regardless of the type of polishing used. The polishing in FIG. 1 results in a substantially planar surface across the substrate 500. Note that there may be a slight difference in the height of the feature 502 relative to the surface of the substrate 500. This slight curvature or differnce in height of the surface of metal 502 after polishing is referred to as dishing. This dishing occurs because the prior art polishing slurry for polishing material 502 is usually chosen to be highly selective to the material 500, whereby the material 502 is etched at a fast rate while the oxide material 500 is etched at a much slower rate. This selectivity is chosen so that the process can endpoint on the layer 500 and/or can over-polish for a substantial period of time to improve process control and yield without substantial oxide damage.

However, the percentage of exposed metal area after the oxide 500 is exposed by polishing is very small. In other words, the exposed metal regions 502 are typically contacts in FIG. 1 and have very small footprints when viewed from a top perspective (the contacts has a top footprint surface area of less than 1 micron). Therefore, with the structure of FIG. 1 there is no substantial dishing problem regardless of the use of high selectivity polishing or low selectivity polishing and regardless of over-polish times due to the fact that the metal contacts have a very small footprint. Accordingly, tungsten plug contact polishing and like low density polishing have not presented dishing problems whereby focus on selectivity is needed, and therfore, the CMP art has generally ignored selectivity as it pertained to polishing in this context.

Referring to the prior art FIG. 2, features 506, which may also be of the same type as feature 502, are shown in a high density configuration. In the high density configuration, as illustrated in prior art FIG. 2, the polishing process has the effect of creating erosion or substantial dishing of the high density region. Specifically, as polishing progresses to expose the underlying oxide layers by removing top portions of the metal layer 506, the interaction between the polishing pad and the surrounding silicon dioxide is such that the polishing forces encourage an erosion or breaking away the oxide corners adjacent metal regions. This erosion effect, as illustrated in FIG. 2, further encourages the creation and continuation of a dishing effect whereby oxide and metal in dense metal areas are eroded whereby one or more dishing regions result as illustrated in FIG. 2. As a result, the topography of the wafer between high density regions and low density regions is very different resulting in a non-planar surface. In addition, many contacts 506, as illustrated in FIG. 2, may be adversely thinned as compared to other contacts on the same itnegrated circuit (IC). Differences in planarity across a wafer and selective erosion of via metal in dense areas are disadvantageous in the IC industry. Therefore, for high selective polishing, the polishing of both low density and high density regions on the same wafer is problematic.

FIG. 3 illustrates a further ramification of the disadvantageous dishing effect as is known in the prior art. Specifically, when a feature 504 having a large width (generally greater than 20 microns) is formed and polished, a dishing effect occurs wherein the feature 504 will have a lesser thickness near the center of the feature 504 as opposed to the edge of the feature 504 which is adjacent the surrounding oxide sidewall. Therefore, polishing metal layers lying within both larger dimension openings and small openings on an IC is problematic due to the larger dimension dishing and erosion that occurs with high selectivity CMP processing. Since dual inlaid interconnects involve both high density and low density regions and large disparity between opening dimensions, high selectivity polishing is not optimal for modern integrated circuit design given the disproportionate dishing phenomena illustrated in FIGS. 1–3.

Prior solutions to the dishing and erosion problems are numerous. One prior art solution has dealt with optimizing the polishing process for a specific device structure. For example, if a given layer is known to contain closely space interconnect lines, the process would be optimized to this dense structure type. Another solution has been to limit the amount of over-polish used with selective polishing processes. Yet another solution has been to add intra die dummy structures to make a device having a more uniform density, allowing for the use of an optimized polishing process. All of these solutions are complex and not without added cost.

In summary, in the prior art where Tungsten plugs have been polished with CMP, the affects of intra-die topographies do not come into play due to the small dimension of the resulting contact plugs. Regardless of the selectivity of the polishing process, the resulting topography will be substantially planar following the deposition of a metal layer. Therefore, the polish process which removes the excess tungsten from the surface is not a critical function of selectivity. Historically, this process would occur with an alumina abrasive and an oxidizing agent without selectivity being a concern. The use of the alumina agent has been used primarily because of the hardness of alumina and the increased polishing rate which can be achieved.

For interconnect layers of larger density than tungsten-plugged contacts, the use of high selectivity CMP processes has been used in order to define the planar surface to be substantially even with the surrounding oxides of the interconnect features. However, as previously discussed, the high selectivity prior art methods described previously cause the dishing, and erosion, as illustrated previously with references to FIG. 2 and FIG. 3.

Therefore, it would be beneficial to identify a low-selectivity polishing method which allows for uniform polish processing on interconnect levels where various feature sizes, densities, and structures are present while reducing the dishing and erosion problems discussed hereinabove.

Figure 1:
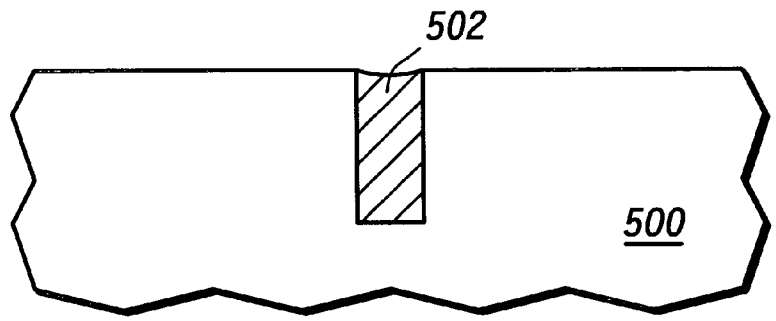
FIGS. 1–3 illustrate, in separate cross sectional views, a portion of a semiconductor substrate polished in accordance with the prior art and demonstrating the problems of dishing/erosion.

It will be appreciated that for simplicity and clarity of illustration, elements illustrated in the Figures have not necessarily been drawn to scale. For example, the dimensions of some of the elements are exaggerated relative to other elements for clarity. Further, where considered appropriate, reference numerals have been repeated among the Figures to indicate corresponding or analogous elements.

DESCRIPTION OF A PREFERRED EMBODIMENT

Figure 2:
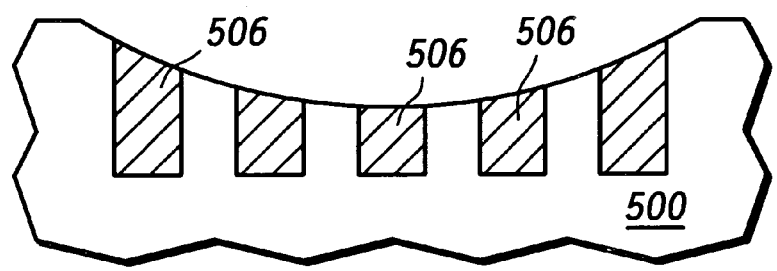
Figure 3:
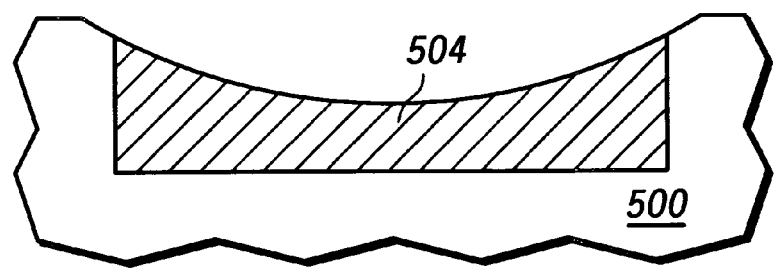

Generally, the present invention is a method for chemical mechanical polishing (CMP) a metal layer over a dielectric layer using a low selectivity metal:oxide polish (less than 5:1 selectivity is used and preferably around 1:1 selectivity is preferred). Although high selectivity polishing provide the advantage of an easy built-in etch stop capability and the ability to over-polish without significant worry, these high selectivity processes will significantly dish certain types of denser wafer regions as illustrated in FIGS. 1–3 herein. The low selectivity etch taught herein trades off endpoint ease (e.g., endpointing is more complex since layer thicknesses should be controlled accurately and polishing should be critically timed in the methods herein for improved results) for a low selectivity process which significantly reduces dishing and improves intra-die planarity on a wafer. The low selectivity polish of metal:oxide is obtained by using a harder polish pad made of polyurethane and having a shore D hardness of greater than roughly 50. In addition, a silica abrasive and oxalic acid are used in the CMP slurry to further lower the metal:oxide selectivity of the polish. The need for a low-selectivity polish is greater when a wafer contains either: (1) both low density and high density regions; and/or (2) both large patterned metal areas (e.g. bond pads, capacitor plates, etc.) and small patterned areas (e.g., conductive vias) at the same level to be polished. Therefore, the need for this low selectivity CMP methodology is high when making dual inlaid or single inlaid interconnect structures. By using the special slurry and polishing pad taught herein, a low-selectivity polish can be utilized to first create a planar surface in the overlying metal and then transfer this planar surface into the underlying metal and oxide whereby intra-die planarity is achieved over the prior art.

The invention can be further understood with reference to FIGS. 4–7.

Figure 4:
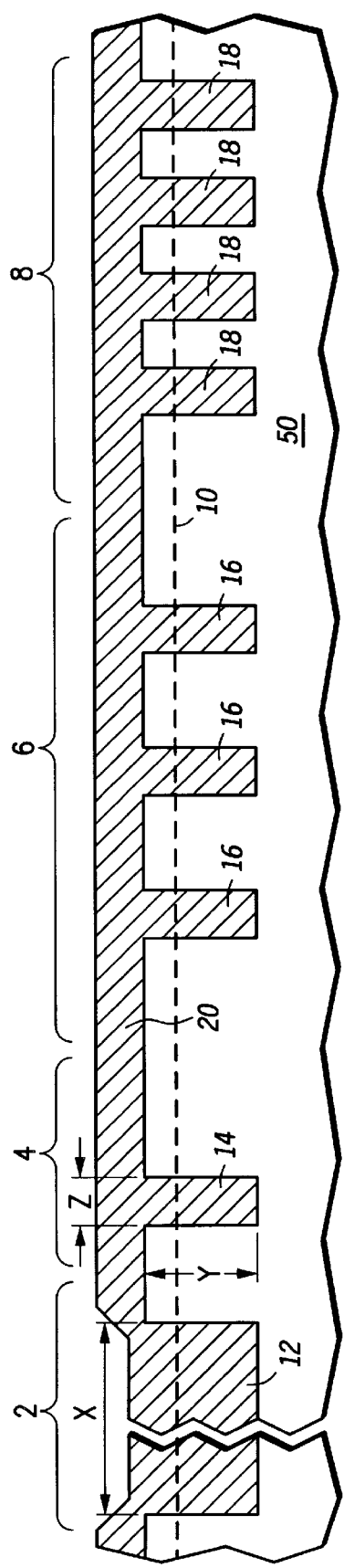
FIG. 4 illustrates, in cross sectional view, an example of a substrate prior to polishing in accordance with the present invention.

FIG. 4 illustrates a layer 50 of a semiconductor device having features defined therein. Specifically, layer 50 includes a dielectric material used to form dual inlaid or inlaid interconnects and typically overlies another conductive layer and/or a substrate wafer. Typical materials used for layer 50 are tetraethylorthosilicate (TEOS) glass, borophosphosilicate glass (BPSG), silicon nitride, oxynitrides, and like dielectric materials. Generally the openings or features made in layer 50 will be defined following a masking and patterning step using conventional photolithographic processing. The features/openings illustrated in FIG. 4 are physically spaced apart from each other and geometrically defined to create four distinct types of regions 2–8.

The regions are typically defined as being low density regions, medium density regions, or high density regions. A low density regions is a region of the topography of the semiconductor wafer wherein exposed metal is less than 5% of the total top wafer surface area after polishing is complete (i.e., oxide is over 95% of the exposed surface area after polishing is complete). An example of this low density region includes an area were sparse isolated contact structures are spaced far apart from each other, an area where interconnects are short and separated by great distances, a scribe line area, etc. Medium density regions are areas where the exposed conductive surface area of the surface after polishing is between 5% and 30%. High density regions are areas where the exposed conductive surface area of the surface after polishing is above 30%. Examples of high density regions include address and data bus routing regions, bit cell memory areas, bond pad locations, capacitor electrode regions, and the like.

A first high density region 2 of FIG. 4 includes a feature 12 having a width X which is much larger than the feature depth Y. Region 2 is a high density region since a large percentage of the top surface of the region 2, after polishing is complete in FIG. 6, will contain exposed metal. A region 4 is illustrated in FIG. 4 which contains a feature 14. Feature 14 represents an isolated contact wherein the width of the contact 14 would be Z which would be equal to or less than the depth of a feature 14 which is illustrated as Y. Typically Z is on the order of less than 1 micron and is typically on the order of less than 0.25 microns in modern IC designs. The area 6 of FIG. 4 illustrates the features 16. The features 16 are closely spaced unlike the features 14 of area 4 whereby the features 16 combine to produce a intermediate or medium pattern density. The features 16 will generally have the same width Z as previously discussed, however, because of the close proximity of other similar features, region 6 is considered to have an intermediate density wherein 5%–30% of metal is exposed at a top surface of the silicon wafer after polishing completes (see FIG. 6). The area 8 of FIG. 1 is shown to have a plurality of features represented by features 18. The features 18 form a high density area within region 8 in that exposed metal after polishing comprises over 30% of the top surface material.

It is important to note in FIG. 4 that layer 50 would include both dielectric isolation layers, lithographic features, conductive layers, and a substrate and be any semiconductor IC device, flat panel display, or the like. Since the configuration of such underlying layers and elements is not important for understanding the present invention, these layers and elements are not specifically shown in the figures and are not further described herein. In addition, it should be noted that the purpose of showing at least two different feature widths is that a variety of feature widths are likely to be found overlying a semiconductor substrate, and the low selectivity polish taught herein is particularly suited for polishing metals which fill a variety of feature widths from large widths (greater than or equal to 20 microns) to small widths (less than 1 micron).

Figure 5:
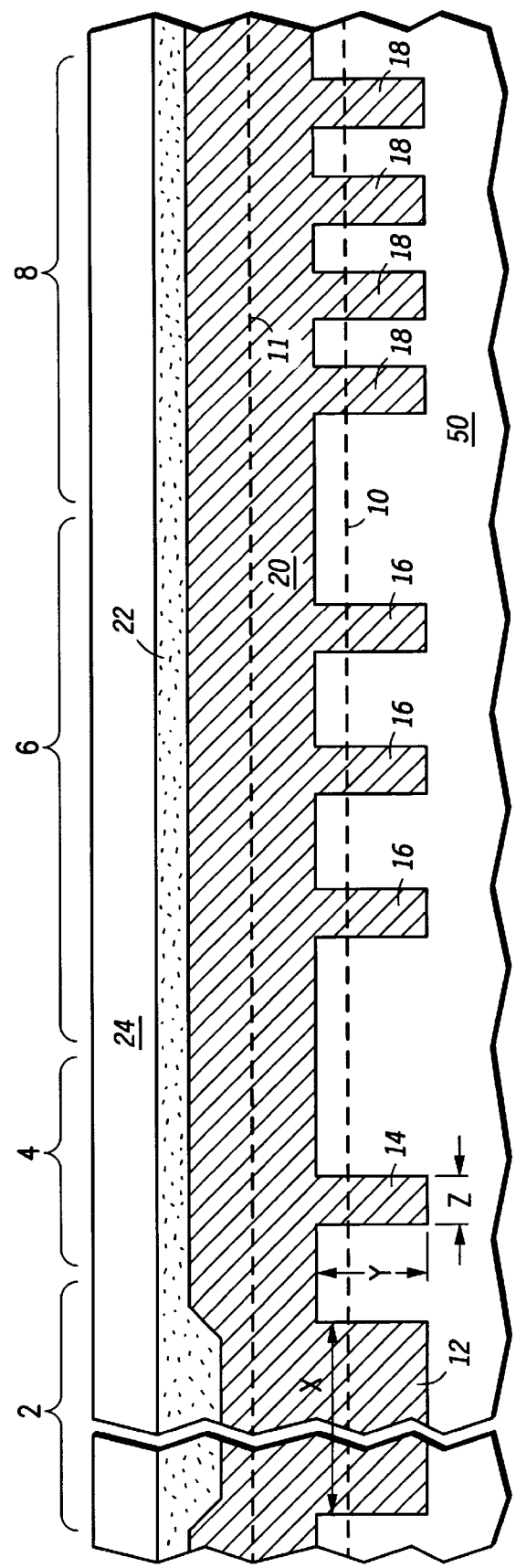
FIG. 5 illustrates, in cross sectional view, the polishing step used to polish the wafer of FIG. 4 in accordance with an embodiment of the present invention.

FIG. 5 illustrates the semiconductor device of FIG. 4 after the deposition of a metal layer 20 over the dielectric layer 50. It would be understood by one skilled in the art, that the metal layer 20 could be deposited using any conventional deposition techniques such as a chemical vapor deposition (CVD) or a sputtering process. It can be seen that the metal layer 20 has non-planar topography or a recess in the area 2 where the large feature 12 has been previously defined. This topography is due to the inherent nature of a conventional and conformal metal deposition process. The recess in area 2 which overlies the wider feature 12 is one factor that leads to the dishing problem discussed previously with respect to FIG. 3. To planarize surface of wafer in FIG. 5, in preparation for the deposition of additional subsequent layers, portions of the metal layer 20 above the upper planar portions of the oxide layer must be removed uniformly, despite the presence of the recess in the metal layer over the feature 12, despite density differences, and despite differences in widths X and Z. Ideally, as a result of polishing the metal layer 20, the features 12, 14, 16 and 18 would remain and be planar to one another as well as an upper surface of the oxide 50.

After formation of the blanket metal layer 20, FIG. 5 illustrates that a slurry 22 and a polishing pad 24 are applied to the metal layer 20. The slurry 22 is illustrated as residing within a space between the polishing pad 24, and the metal layer 20. The chemical interaction of the slurry 22 with the metal layer 20 and the rotational polishing effects of the pad 24 combine to planarize the metal layer 20. Higher topographical portions of the layer 20 will initial polish at a faster rate than lower topographical portions of the layer 20 in FIG. 5.

The present invention uses specific metal interconnects, a specific slurry, and a specific polishing pad in order to effectively polish the metal layer 20 and top portions of the oxide 50 using a low selectivity polish whereby broad range of device types, differing densities, and different geometries of inlaid interconnect trenches are polished with reduced dishing. Specifically, the metals such as aluminum or copper. It should also be understood, that the interconnect metals would also include whatever barrier layers, etch stops, nucleation layers, and like layers which are associated with the actual interconnect metal. For example, a titanium nitride (TiN), tantalum silicon nitride, tantalum nitride, like barrier metal, or a composite barrier may be used under or over a metallic layer as taught herein. Therefore, it should be understood that any reference to metal layer 20 would include any associated barriers associated with that structure.

The slurry 22 of FIG. 5 is selected so that the combination of the slurry and the polishing pad 24 results in a metal:oxide selectivity ratio of preferably 1:1 is provided. In other words, the slurry 22 and the pad 24 ensure that, in a preferred form, if the metal layer 20 is polished at a rate of 2,000 angstroms per minute then the oxide comprising layer 50 is also polishes at roughly the 2,000 angstrom per minute rate. While a 1:1 selectivity ratio is preferable, other selectivities may be used while still resulting in reduced dishing. Generally, the metal:oxide selectivity should be less than a 5:1 to obtain reduced dishing. The slurry is chosen to have a silicon component (preferably silica) and oxalic acid in a preferred embodiment. When the metal layer 20 is aluminum, the silicon dioxide oxalic acid slurry has proven to provide a selectivity of near 1:1. In addition to or in lieu of the oxalic acid, other commercially available oxidizers may be utilized in the slurry 22. Examples of such oxides would be any peroxide-based oxidizer. While the specific embodiment discussed deals with the aluminum metal layer 20 in combination with a silica/oxalic acid slurry 22, it is believed that any slurry used in the process of polishing copper while having silica as a component will result in reduced dishing via low selectivity polishing.

The polishing pad 24 is chosen to be a hydrophilic pad having a shore D hardness of greater than 50. It would be understood by one skilled in the art that a shore D hardness down to the range of approximately 40 could be used, however, a hardness of 50 or greater would be preferable. Examples of such pads having a shore D hardness in this range would be pads commercially available from Rodel, such as the IC1000, IC2000, or IC1400 pads. The use of a hydrophilic pad is important since it enables interaction between the pad 24 and the silica in order to encourage physical abrasion between the polishing pad 24 and the polishing layer 20 such that a planar surface 11 is eventially formed in the metal due to lower topography regions of layer 20 initially etching slower than higher topography regions of layer 20. Preferably, the polishing pad 24 is made of polyurethane herein.

The interaction of the polishing pad 24 and the metal layer 20 given the silica/oxalic acid combination, will allow for the top portions of the metal layer 22 to be polished away along with top portions of the oxide within layer 50 down to a final surface of line 10. In a time sequential progression, the recessed portion over feature 12 would not be polished until after upper portions of the layer 20 overlying regions 4–8 are removed over time to form the planar surface 11 of FIG. 5. As a result, due to initial polishing of higher areas of layer 20, a planarized metal surface at the height 11 of FIG. 5 is first formed by polishing layer 20 though the use of a harder polishing pad 24. Further polishing is then performed to continue to remove the metal and oxide lying at the surface of the line 11. Specifically, polishing is continued to allow for removal of more metal from the planar surface 11 until top portions of the oxide layer 50 is exposed. Once the oxide layer 50 is exposed below line 11, polishing continues in a timed manner until a small top portion of the oxide 50 is consumed and codncutive dual inlaid or inlaid structures are formed in the features/openings 12–18 (see FIG. 6). This removal of both oxide material 50 and conductive material 20 is accomplished because of the 1:1 metal:oxide selectivity due to the combination of slurry 22 and pad 24 previously introduced. Because of this low selectivity ratio, both the oxide and the aluminum of metal layer 20 will be etched away leaving a substantially planar surface 10 as indicated in FIG. 5 and shown in final form in FIG. 6.

Figure 6:
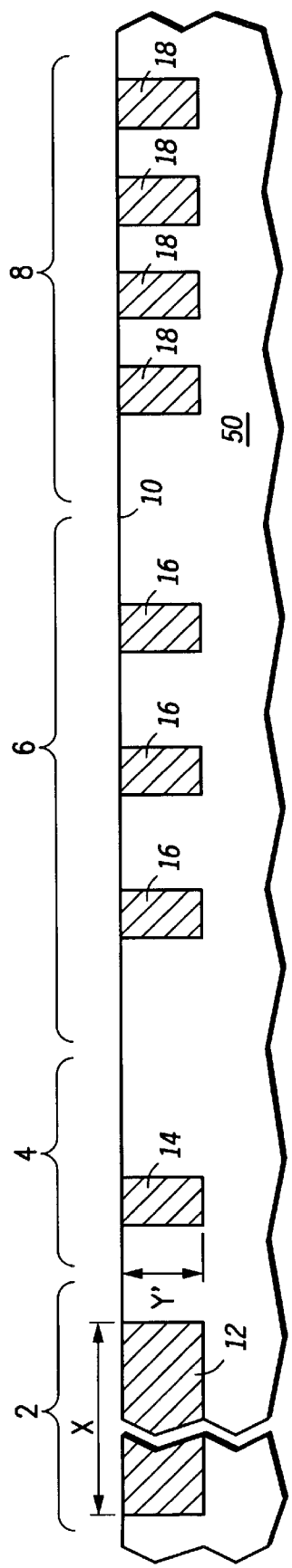
FIG. 6 illustrates, in cross sectional view, the substrate of FIGS. 4–5 after polishing in accordance with the present invention.

FIG. 6 illustrates that the initial planar surface 11 formed entirely within metal 20 is transferred to a substantially planar surface 10 of both the metal 20 and the oxide 50. It has been shown that the use of the CMP process taught herein will result in reduced dishing effects of less than approximately 500 Å for a feature such as opening 12 which have a great width or length X relative to the inlaid depth Y. In other words, inlaid metal thickness at the sidewall of inter-level dielectrics will differ or "dish" from the metal thickness at the center of the feature by less than 500 Å. The reduced dishing of less than or equal to 500 Å occurs for all structures of FIG. 6 independent of aspect ratio, density, structural differences, etc., due to the low selectivity of the polish process taught herein.

Therefore, the use of a low selectivity polish to form interconnect regions across low, medium, and high density wafer regions, allows for a more uniform planar surface 10 to be achieved in an intra-die manner. As a result, the dishing and erosion previously seen with the prior art of FIGS. 1–3 is minimized using the process taught herein.

Figure 7:
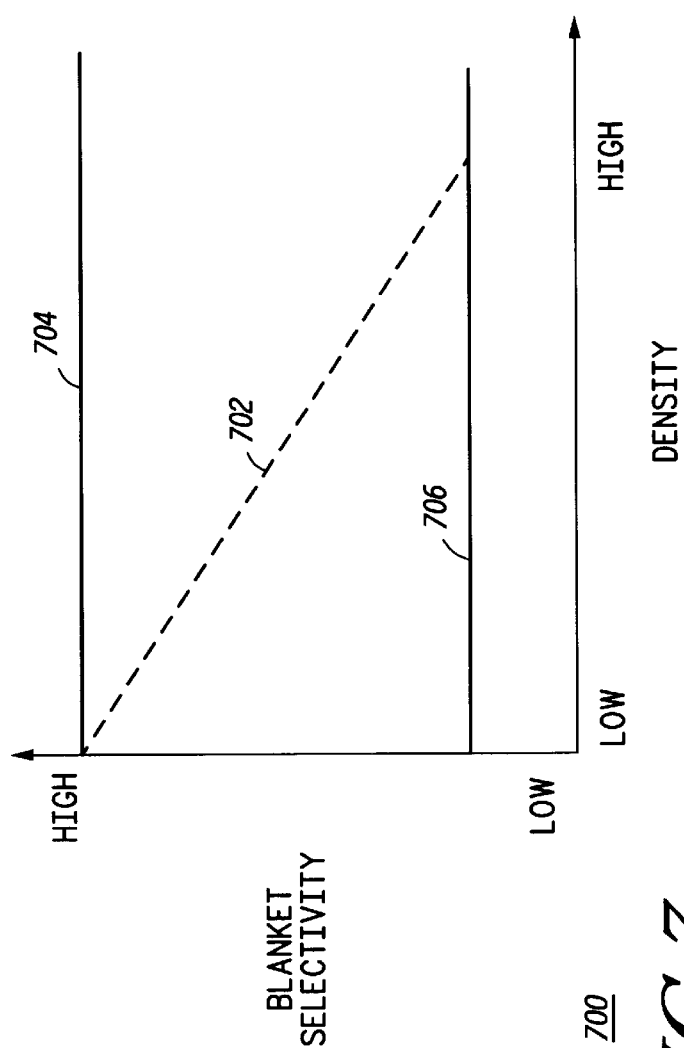
FIG. 7 illustrates, in graphical form, an X-Y plot illustrating a selectivity ratio versus a pattern density for a polish process in accordance with the present invention.

FIG. 7 illustrates an X-Y graph which plots the device density of an IC surface to the resulting selectivity of the polishing process. Specifically, the line 702 in FIG. 7 illustrates the blanket selectivity which results when a prior art polishing process is used. Blanket selectivity refers to the combined effects of polishing a die surface. When a low density feature area is polished by this prior art process (e.g., isolated tungsten plug regions) the blanket selectivity would be high and the overall dishing and erosion effects are small. This illustrates that the dishing effects of low density devices is generally not consequential. However, for high density areas of the silicon wafer, the same process which polishes at a high selectivity for low density regions would polish at a low selectivity for high density regions thereby resulting in intra-die dishing and non-planarity across the die as shown in FIGS. 1–3 herein. In other words, in the prior art when using a so-called "high selectivity" process, the selectivity is actually a function of the density pattern. This results in selective dishing and is disadvantageous in the art.

Another method which could be utilized for polishing is illustrated by line 704. Line 704 is a high selectivity process that is independent of density. However, when using this process, the structure of FIG. 3 will dish where the structures of FIGS. 1–2 will not substantially dish due to the consistent high selectivity of the polish. Therefore, to avoid the dishing and non-uniform processing resulting via the processes of lines 702 and 704, the process of line 706 is taught herein. The representation of line 706 indicates, that regardless of feature density, a low selectivity polishing process can be maintained and used whereby intra-die planarity is improved by reducing the dishing phenomenon associated with the processes 702 and 704. By using the silica/oxalic slurry with the ≧50 shore D hardness pad, a consistent low selectivity polishing process 706 can be maintained regardless of area density whereby the dishing of FIGS. 1–3 is reduced or avoided.

In summary, the present invention teaches the use of a hydrophilic pad (e.g., polyurethane pad) having a shore D hardness of 50 or greater. In combination with the pad, a silica slurry containing an acidic oxidizer is introduced to polish a metal layer. The metal layer can contain a combination of very wide structures and thin structures and differing densities and still be polished without resulting inter-die topographies. The combination of the silica based slurry and the hard hydrophilic pad provides for a polishing process having a metal to dielectric polishing ratio of approximately 1:1 whereby this inter-die topography is reduced by allowing both metal and dielectric to be polished at a similar rate unlike the prior art. As such, the erosion, or dishing, normally associated with processes of this type is reduced or avoided.

Although the invention has been described and illustrated with reference to specific embodiments, it is not intended that the invention be limited to those illustrative embodiments. Those skilled in the art will recognize that modifications and variations may be made without departing from the spirit and scope of the invention. For example, one factor that affects the characteristics of the polishing process is the type of polishing pad used. In the semiconductor art, the use of polyurethane pads to polish dielectric layers of a semiconductor substrate is common. Polyurethane pads typically take the form of polyester felt pads impregnated with urethane, micro-porous urethane, or filled/blown composite urethanes. Solid uniform urethane primer sheets have also been proposed for use in CMP. In semiconductor processing, polyurethane pads are typically used to polish oxides, such as silicon dioxides, but are taught herein with a larger shore D hardness to enable them for use in metallic polishing in order to manufacture dual inlaid contact structures. The hardness of this pad may be varied as well as the exact percentage composition of the slurry. Therefore, it is intended that this invention encompass all of the variations and modifications as fall within the scope of the appended claims.

What is claimed is:

1. A method for polishing a metal layer, the method comprising the steps of:

providing a dielectric layer having a top surface;

forming dual inlaid openings in the dielectric layer;

forming a metal layer over the dielectric layer wherein the metal layer fills the dual inlaid openings; and polishing the metal layer using a slurry comprising both a silica abrasive and oxalic acid solution to form a planarized dual inlaid structure where a polishing pad having a shore d hardness of greater than 50 is used.

2. The method of claim 1 wherein the step of polishing comprises:

using a polishing pad comprising polyurethane to provide the shore d hardness of greater than 50.

3. The method of claim 1 wherein the step of forming the metal layer comprises:

forming the metal layer comprising aluminum to form an aluminum dual inlaid interconnect.

4. The method of claim 1 wherein the step of providing a polishing pad comprises:

polishing the metal layer and dielectric layer such that a metal:dielectric selectively is less than or equal to 5:1.

5. The method of claim 4 wherein the step of providing a polishing pad comprises:

polishing the metal layer and dielectric layer such that a metal:dielectric selectively is substantially equal to 1:1.

6. The method of claim 1 wherein the step of patterning the dielectric layer comprises:

patterning a first opening having a dimension of greater than 40 microns and forming a second opening having an area less than 1 micron by 1 micron wherein polish-induced dishing for the first and second openings is substantially equal in severity due to a low metal:dielectric selectivity polish.

7. A method for polishing a metal layer, the method comprising the steps of:

providing a dielectric layer having a top surface;

forming dual inlaid openings in the dielectric layer, a first opening having a first dimension of greater than 40 microns and a second dimension greater than 5 microns, and a second opening having an area less than 1 micron by 1 micron;

forming the metal layer over the dielectric layer wherein the metal layer fills the dual inlaid openings; and polishing the metal layer using a slurry, wherein polish-induced dishing for the first and second openings is substantially equal in severity due to a low metal:dielectric selectivity polish.

8. The method of claim 7 wherein the step of polishing comprises:

providing a polishing pad comprising polyurethane wherein a shore D hardness of the polishing pad is greater than 50.

9. The method of claim 7 wherein the step of forming the metal layer comprises:

forming the metal layer comprising aluminum to form an aluminum dual inlaid interconnect.

10. The method of claim 7 wherein the step of providing a polishing pad comprises:

polishing the metal layer and dielectric layer such that the metal:dielectric selectively is less than or equal to 5:1.

11. The method of claim 10 wherein the step of providing a polishing pad comprises:

polishing the metal layer and dielectric layer such that the metal:dielectric selectively is substantially equal to 1:1.

12. The method of claim 7 wherein the step of polishing comprises:

providing a slurry comprising a silica abrasive and oxalic acid solution.

13. A method for polishing a metal layer on a silicon wafer, the method comprising the steps of:

providing a dielectric layer having a top surface;

forming openings in the dielectric layer to form different regions across the silicon wafer wherein the different regions are of different opening densities;

forming a metal layer over the dielectric layer and within the openings; and polishing the metal layer and the top surface of the dielectric layer using a low selectivity etch whereby opening density regions from 1% to 50% are polished with substantially equal amounts of dishing.

14. The method of claim 13 wherein the step of polishing comprises:

providing a polishing pad comprising polyurethane wherein a shore D hardness of the polishing pad is greater than 50.

15. The method of claim 13 wherein the step of forming the metal layer comprises:

forming the metal layer comprising aluminum to form an aluminum dual inlaid interconnect.

16. The method of claim 13 wherein the step of providing a polishing pad comprises:

polishing the metal layer and dielectric layer such that a metal:dielectric selectively is less than or equal to 5:1.

17. The method of claim 16 wherein the step of providing a polishing pad comprises:

polishing the metal layer and dielectric layer such that the metal:dielectric selectively is substantially equal to 1:1.

18. The method of claim 13 wherein the step of polishing comprises:

providing a slurry comprising a silica abrasive and oxalic acid solution.

* * * * *